United States Patent
Lin

(10) Patent No.: US 7,129,153 B2
(45) Date of Patent: Oct. 31, 2006

(54) PROCESS FOR FORMING POLYCRYSTALLINE SILICON LAYER BY LASER CRYSTALLIZATION

(75) Inventor: Ching-Wei Lin, Taoyuan (TW)

(73) Assignee: TPO Displays Corp., Miao-Li County (TW)

( * ) Notice: Subject to any disclaimer, the term of this patent is extended or adjusted under 35 U.S.C. 154(b) by 139 days.

(21) Appl. No.: 10/767,665

(22) Filed: Jan. 29, 2004

(65) Prior Publication Data

US 2005/0000408 A1    Jan. 6, 2005

(30) Foreign Application Priority Data

Jul. 4, 2003    (TW) ............................... 92118424 A

(51) Int. Cl.
H01L 21/20    (2006.01)
H01L 21/268   (2006.01)

(52) U.S. Cl. ..................................... 438/487

(58) Field of Classification Search ................ 438/487
See application file for complete search history.

(56) References Cited

U.S. PATENT DOCUMENTS

| 4,799,097 | A | * | 1/1989 | Szluk et al. ................ 257/70 |
| 5,766,989 | A | | 6/1998 | Maegawa et al. |
| 5,858,820 | A | * | 1/1999 | Jung et al. .................. 438/150 |
| 5,893,948 | A | * | 4/1999 | Nickel et al. ................. 117/43 |
| 5,972,105 | A | | 10/1999 | Yamazaki et al. |
| 6,187,088 | B1 | * | 2/2001 | Okumura ...................... 117/8 |
| 6,489,222 | B1 | * | 12/2002 | Yoshimoto .................. 438/486 |
| 6,656,270 | B1 | * | 12/2003 | Chung ......................... 117/89 |

FOREIGN PATENT DOCUMENTS

JP    08-316485    11/1996

* cited by examiner

Primary Examiner—Stephen W. Smoot
(74) Attorney, Agent, or Firm—Volpe and Koenig, P.C.

(57) ABSTRACT

A process for forming a polycrystalline silicon layer includes the following steps. Firstly, at least one seed is formed on a substrate. Then, an amorphous silicon layer is formed on the substrate and overlies the seed. Then, the amorphous silicon layer is irradiated with a laser to melt the amorphous silicon layer. Afterward, the molten amorphous silicon layer is recrystallized to form a polycrystalline silicon layer.

16 Claims, 10 Drawing Sheets

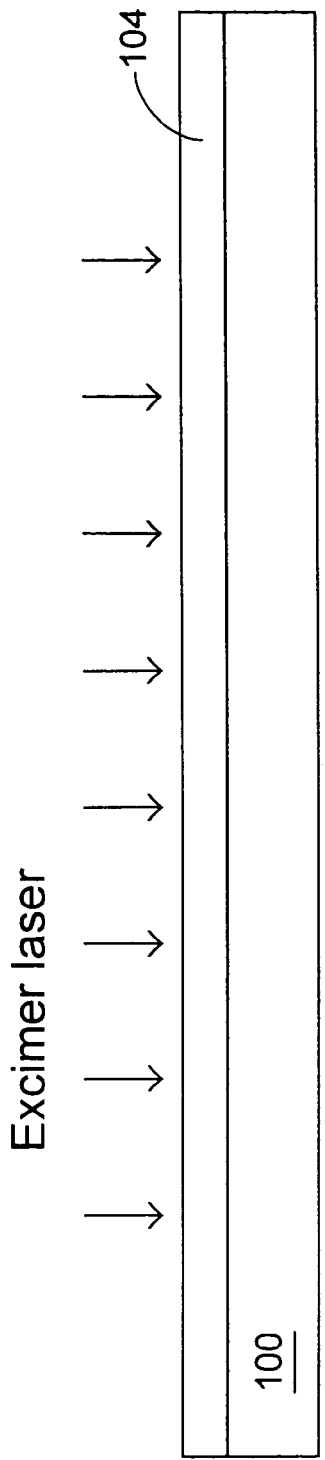
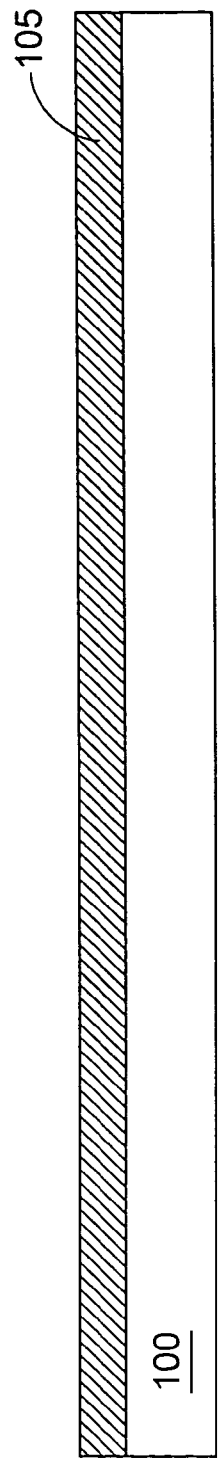
Fig.1(a) PRIOR ART
Fig.1(b) PRIOR ART

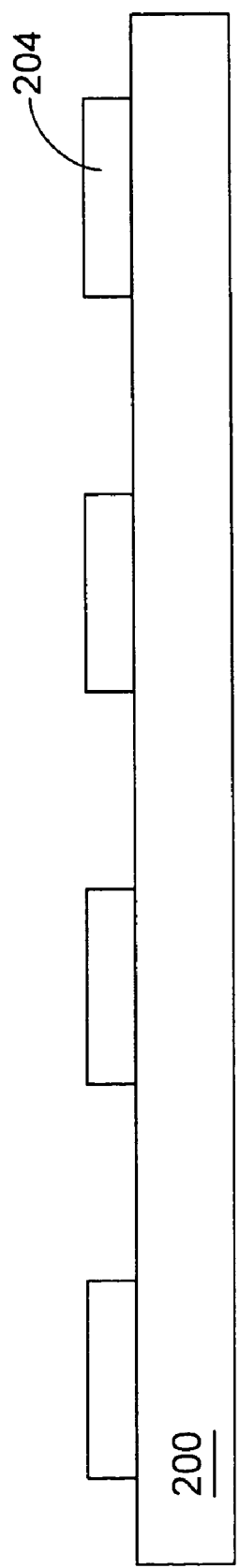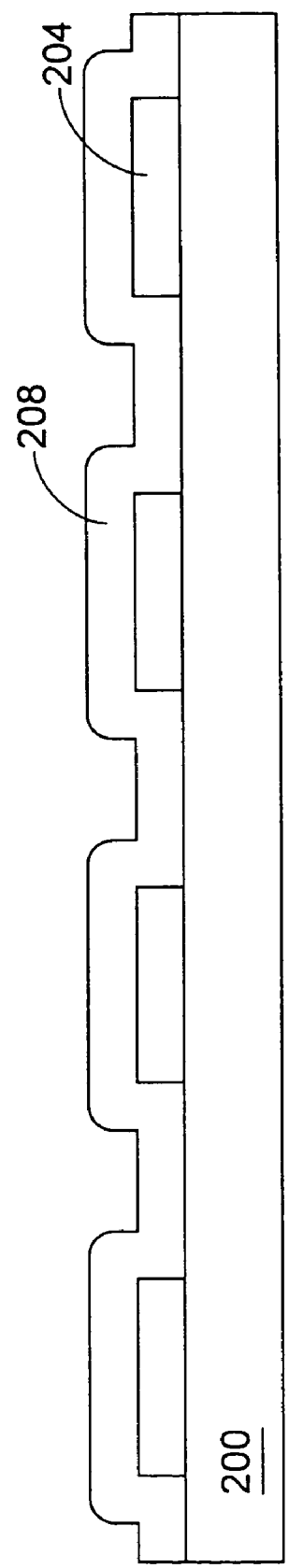

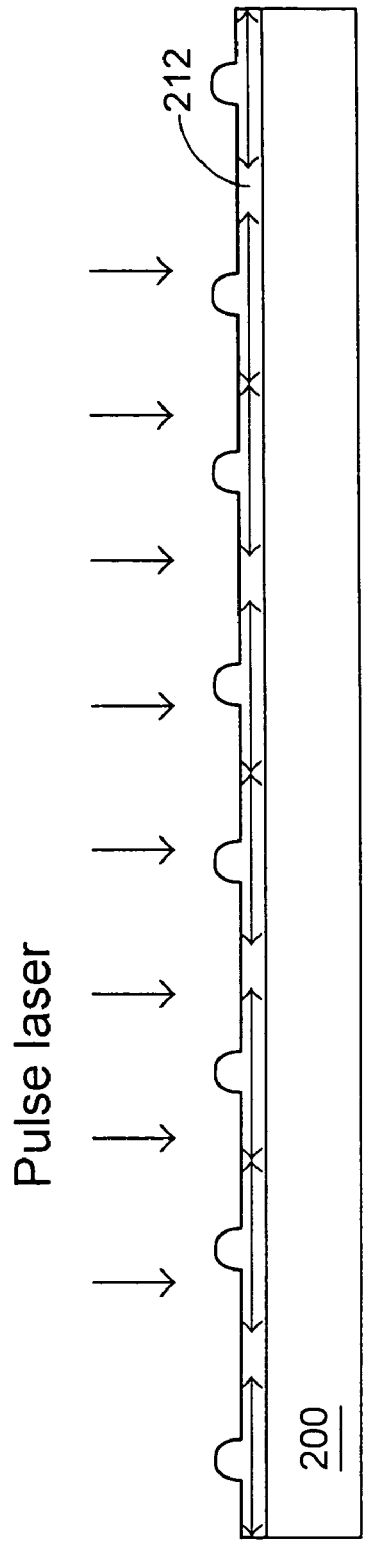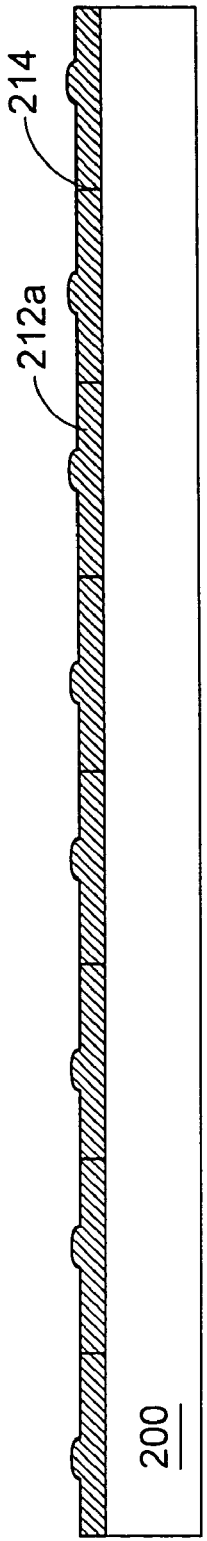

PROCESS FOR FORMING POLYCRYSTALLINE SILICON LAYER BY LASER CRYSTALLIZATION

FIELD OF THE INVENTION

The present invention relates to a process for forming a polycrystalline silicon layer, and more particularly to a process for forming a polycrystalline silicon layer with large crystal grain size and high uniformity by laser crystallization.

BACKGROUND OF THE INVENTION

Polycrystalline silicon thin film transistors are commonly used as basic electronic devices for controlling pixels of active matrix liquid crystal displays (AMLCDs) and active matrix organic light emitting displays (AMOLEDs). In addition, the polycrystalline silicon thin film transistors are also used as basic electronic devices required by the peripheral driving circuits and/or control circuits in these displays.

During production of the polycrystalline silicon thin film transistors (TFTs), the crystallization procedure for forming a polycrystalline silicon layer is critical. The electrical properties and uniformity of the polycrystalline silicon thin film transistors are primarily determined by this procedure.

A conventional process for forming a polycrystalline silicon layer using a crystallization method is illustrated with reference to FIGS. 1(a) and 1(b). Firstly, an amorphous silicon layer 104 is formed on a glass or plastic substrate 100. Then, the amorphous silicon layer 104 is irradiated with an excimer laser to be molten. The molten amorphous silicon layer is cooled and recrystallized into a polycrystalline silicon layer 105.

Referring to FIG. 2, the relationship between the energy density of an excimer laser irradiating on the amorphous silicon layer and the electrical property such as the electron mobility of the resulting recrystallized polycrystalline silicon layer is shown. As shown, the energy density effective for forming a polycrystalline silicon layer with good electrical property is confined to a narrow range. An excessive energy density may result in microcrystalline silicon rather than polycrystalline silicon. The electrical property of microcrystalline silicon is different from that of the polycrystalline silicon. For example, its electron mobility is not as high as required in some applications. On the other hand, an insufficient energy density substantially fails to effectively melt the amorphous silicon for subsequent recrystallization.

Furthermore, due to the variability of the excimer laser, the grain size of the recrystallized polycrystalline silicon layer 105 may be too small and non-uniform, and thus the electron property of the thin film transistor product varies significantly.

SUMMARY OF THE INVENTION

It is an object of the present invention to provide a process for forming a polycrystalline silicon layer consisting of relatively uniform and large crystal grains.

It is another object of the present invention to provide a process for forming a polycrystalline silicon layer with a less critical energy-density range of an pulse laser for the crystallization of the polycrystalline silicon layer.

In accordance with a first aspect of the present invention, there is provided a process for forming a polycrystalline silicon layer. Firstly, at least one seed is formed on a substrate. Then, an amorphous silicon layer is formed on the substrate and overlies the seed. Then, the amorphous silicon layer is irradiated with a laser to melt the amorphous silicon layer. Afterward, the molten amorphous silicon layer is recrystallized to form a polycrystalline silicon layer.

In one embodiment, the step of forming the at least one seed on the substrate comprises sub-steps of forming an intermediate covering layer on the substrate, patterning the intermediate covering layer to define the intermediate covering layer as a specified pattern, forming an amorphous silicon spacer beside the specified pattern, and removing the specified pattern with the spacer remained.

For example, the substrate is a glass substrate or a plastic substrate, the laser is an excimer laser, and the intermediate covering layer is made of silicon nitride or metal.

In accordance with a second aspect of the present invention, there is provided a process for forming a polycrystalline silicon layer. Firstly, a first region and a second region on a substrate are defined. Then, at least one seed on the first region of the substrate is formed. Then, an amorphous silicon layer is formed on the first and the second regions of the substrate. Then, the amorphous silicon layer is irradiated with a laser to melt the amorphous silicon layer. Afterward, the molten amorphous silicon layer is recrystallized on the first region to form a polycrystalline silicon layer.

If necessary, the process can further comprise a step of recrystallizing the molten amorphous silicon layer on the second region to form a microcrystalline silicon layer.

In accordance with a third aspect of the present invention, there is provided a process for fabricating a polycrystalline silicon layer. Firstly, a substrate is provided. Then, an intermediate covering layer is formed on the substrate. Then, the intermediate covering layer is patterned to define the intermediate covering layer as a specified pattern. Then, an amorphous silicon spacer is formed beside the specified pattern. Then, the specified pattern with the spacer remained is removed to form at least one seed the substrate. An amorphous silicon layer is then formed on the substrate and overlies the seed. Then, the amorphous silicon layer is irradiated with a laser to melt the amorphous silicon layer. Afterward, the molten amorphous silicon layer is recrystallized to form a polycrystalline silicon layer.

Accordingly, the present invention will become more readily apparent to those ordinarily skilled in the art after reviewing the following detailed description and accompanying drawings, in which:

BRIEF DESCRIPTION OF THE DRAWINGS

FIGS. 1(a) and 1(b) are schematic cross-sectional diagrams illustrating a conventional process for forming a polycrystalline silicon layer by using a crystallization method;

FIGS. 3(a) to 3(i) are schematic cross-sectional diagrams illustrating a process for forming a polycrystalline silicon layer of a thin film transistor according to an embodiment of the present invention;

DETAILED DESCRIPTION OF THE PREFERRED EMBODIMENT

A process for forming a polycrystalline silicon layer of a thin film transistor is illustrated with reference to FIGS. 3(a) to 3(i).

Figure 2:
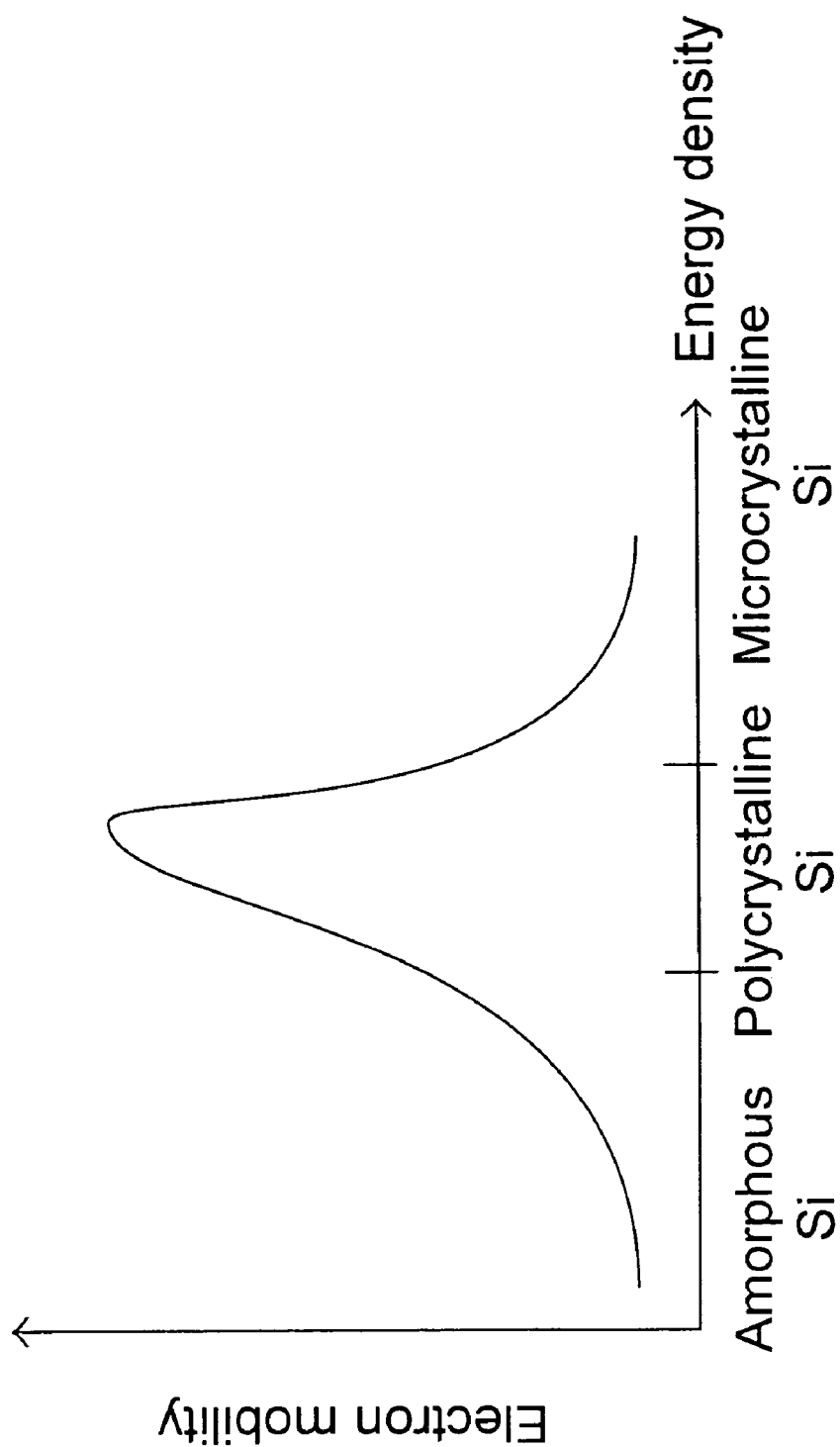
FIG. 2 is a plot showing the electron mobility change and phase change with the energy density of an excimer laser irradiating on the amorphous silicon layer according to prior art.
Figure 3A:
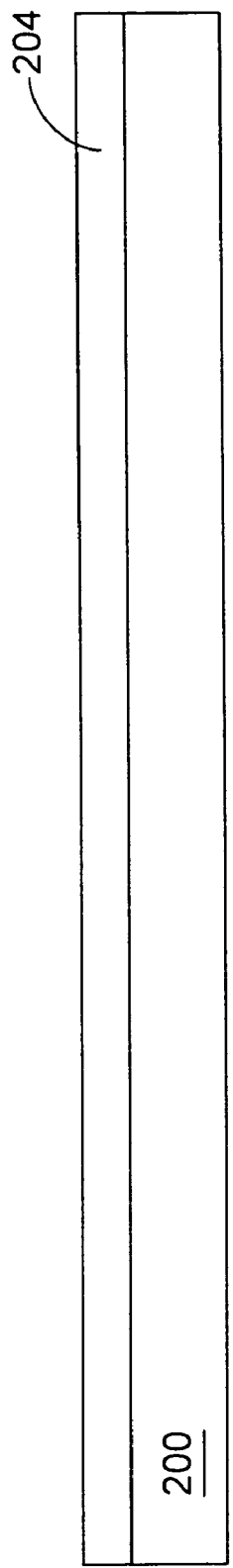

In FIG. 3(a), an intermediate covering layer 204, for example made of silicon nitride (SiNx) or metal, is formed on a substrate 200 such as a glass or a plastic substrate.

Figure 3B:
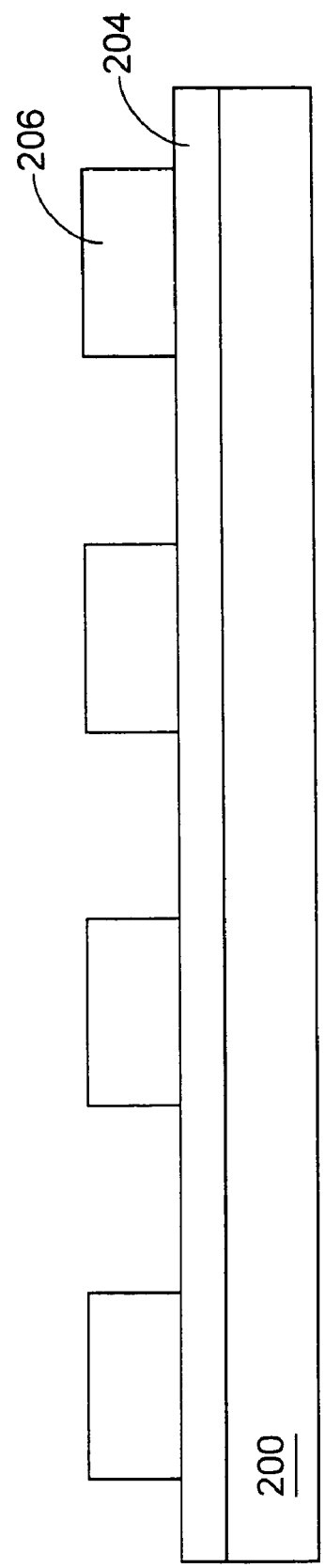

Then, as shown in FIG. 3(b), a photoresist 206 is formed on the intermediate covering layer 204 and properly patterned to cover selected regions of the intermediate covering layer 204. The intermediate covering layer 204 is then etched with the photoresist 206 serving as a mask. After the etching procedure is completed and the photoresist 206 is removed, a specified pattern of the intermediate covering layer 204 is obtained, as can be seen in FIG. 3(c).

Figure 3E:
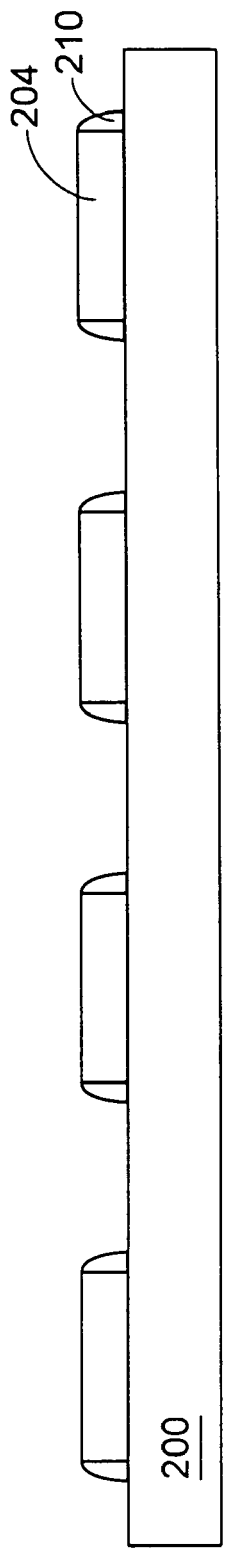

In FIG. 3(d), an amorphous silicon layer 208 is then formed on the resulting structure of FIG. 3(c). An anisotropic etching procedure is subsequently performed on the amorphous silicon layer 208, thereby forming amorphous spacers 210 beside the specified pattern of the intermediate covering layer 204, as can be seen in FIG. 3(e).

Figure 3F:
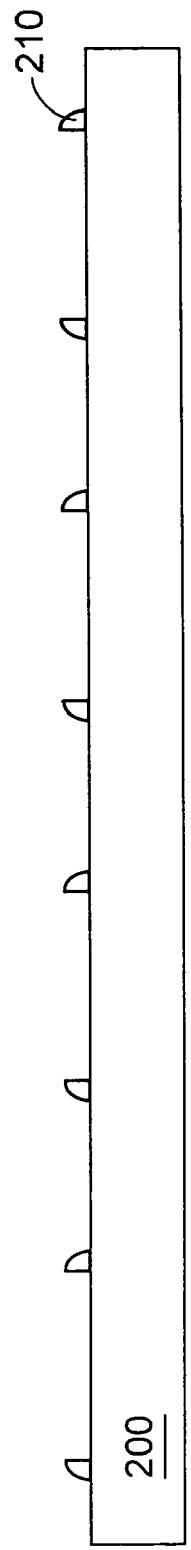

Then, as shown in FIG. 3(f), the specified pattern of the intermediate covering layer 204 is removed, but the amorphous spacers 210 remain on the substrate 200. The remaining amorphous spacers 210 are used as seeds for the following crystallization procedure.

Figure 3G:
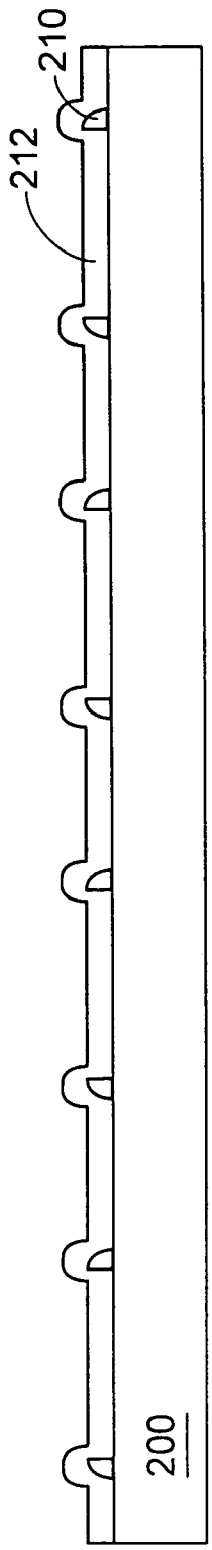

In FIG. 3(g), additional amorphous silicon layer 212 is formed on the substrate 200 and overlies the seeds 210. Then, as shown in FIG. 3(h), the amorphous silicon layer 212 is irradiated with a pulse laser (for example an excimer laser) to melt the amorphous silicon layer 212. By controlling energy density of the pulse laser, the amorphous silicon layer 212 can be fully melted. Meanwhile, the seeds 210 remaining on the substrate 200 will not be fully molten. In such manner, when the molten amorphous silicon layer 212 is cooled, the seeds 210 will promote formation of relatively uniform and large crystal grains along both sides of the seeds (in the arrow directions). Thus, the molten amorphous silicon layer 212 is recrystallized to form a polycrystalline silicon layer 212a as shown in FIG. 3(i), and grain boundaries 214 are formed in the polycrystalline silicon layer 212a.

Figure 4A:
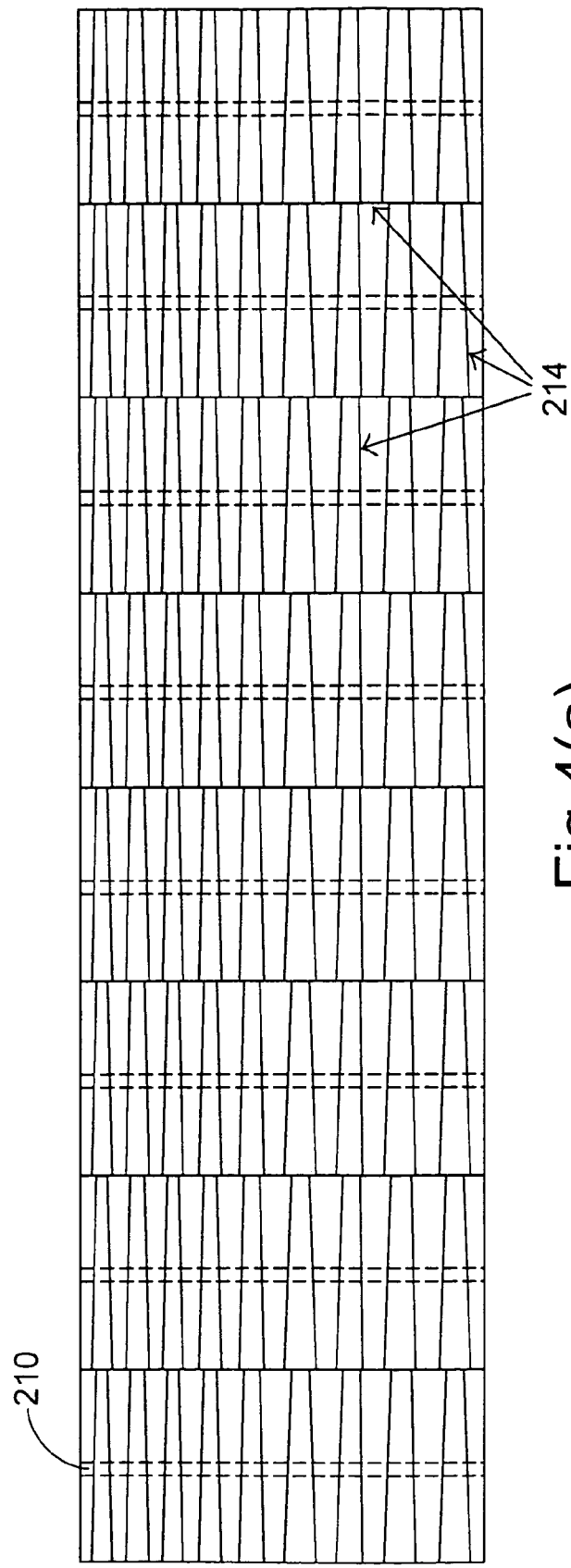
FIG. 4(a) is a top view of a polycrystalline silicon layer formed according to the process of the present invention.
Figure 4B:
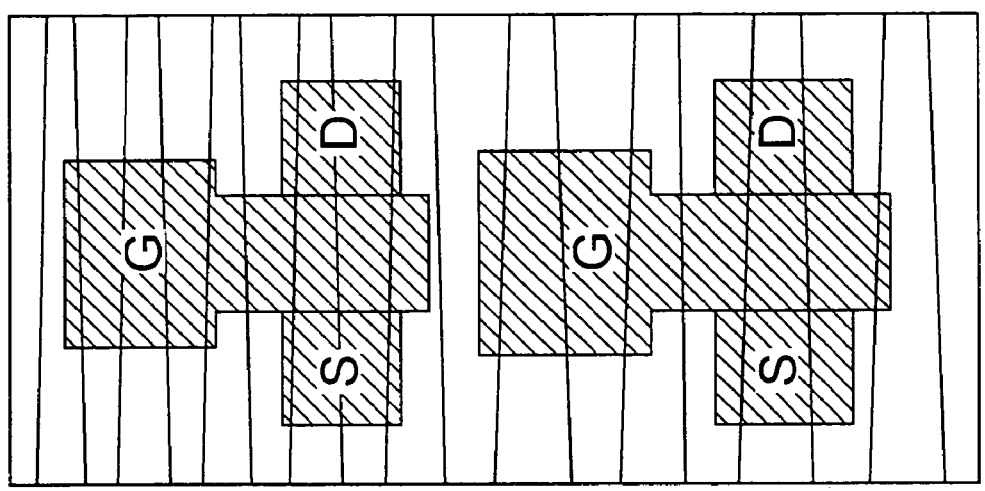
FIG. 4(b) is a top view of the polycrystalline silicon layer of FIG. 4(a) formed thin film transistors.

The polycrystalline silicon layer formed according to the process of the present invention is illustrated in FIG. 4(a). In FIG. 4(a), the regions between two dotted lines indicate the location of the seeds 210, while the solid lines indicate the grain boundaries 214, respectively. Afterwards, thin film transistors are formed by any of suitable manufacturing processes, which are not intended to be described redundantly herein. In FIG. 4(b), the hatched portions indicate the location of the thin film transistors, and the source electrodes S, the gate electrodes G, the drain electrodes D and thus channels of the thin film transistors are shown.

Figure 5:
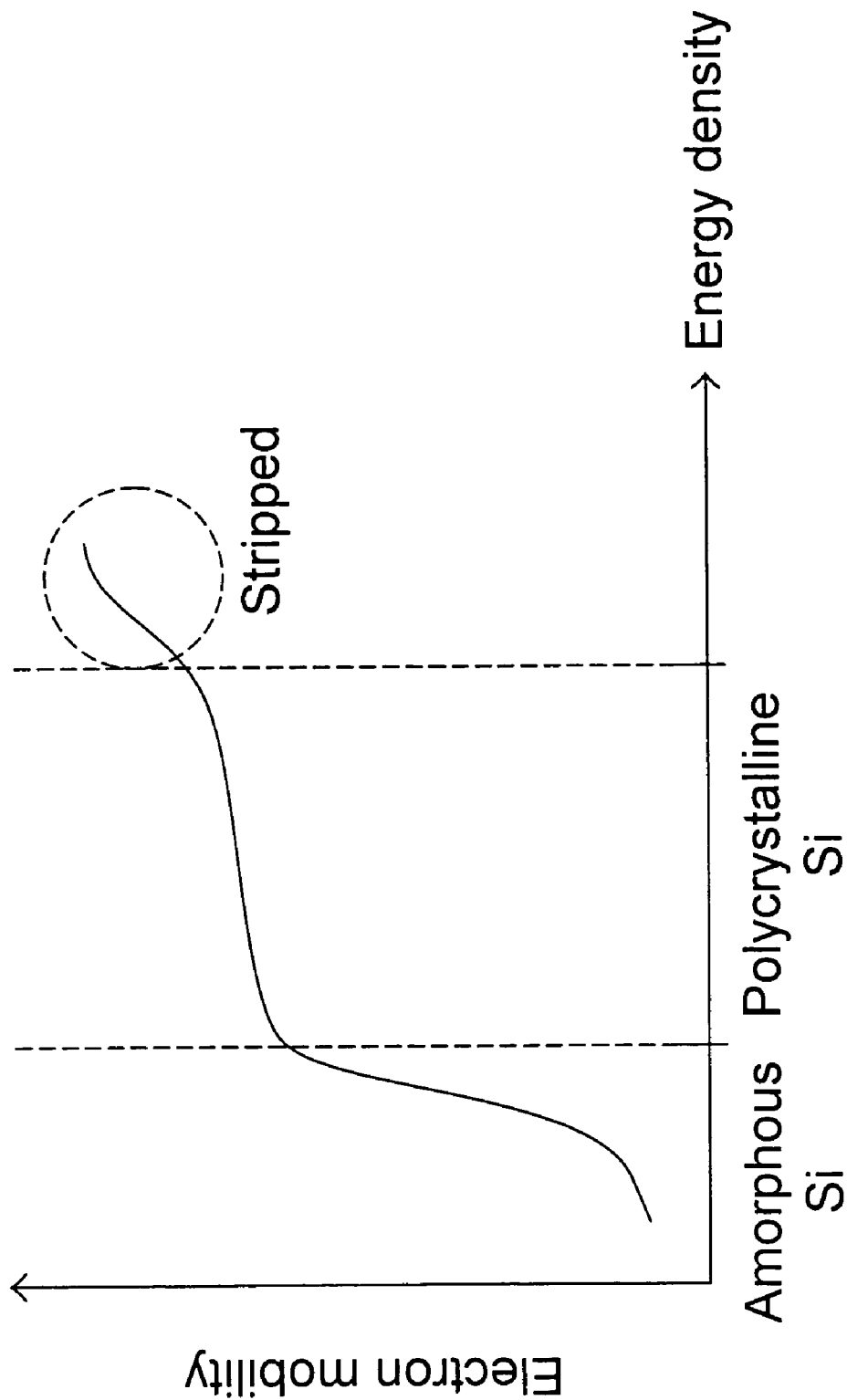
FIG. 5 is a plot showing the electron mobility change and phase change with the energy density of a pulsed laser irradiating on the amorphous silicon layer according to the present invention.

As previously described, the energy density of the pulse laser (for example an excimer laser) effective for forming a polycrystalline silicon layer with good electrical property is confined to a narrow range. The improper energy density is likely to result in the formation of microcrystalline silicon instead of desired polycrystalline silicon or result in non-uniform grain size of the recrystallized polycrystalline silicon layer. According to the present invention, seeds are additionally provided between the substrate and the amorphous silicon layer prior to the formation of the amorphous silicon layer. Accordingly, when a certain energy density of excimer laser required for melting the amorphous silicon layer in the prior art, or even if a little more intense excimer, is applied to the amorphous silicon layer of the present invention for the same period of time, the seeds are protected from being molten away. In other words, the energy-density range of an excimer laser suitable for melting and recrystallizing the amorphous silicon layer into the polysillicon layer can be broadened. Referring to FIG. 5, the relationship between the energy density of a pulse laser irradiating on the amorphous silicon layer and the electrical property such as the electron mobility of the resulting recrystallized polycrystalline silicon layer is shown. As shown, the energy density effective for forming a polycrystalline silicon layer with good electrical property is broadened. After the amorphous silicon layer is fully melted and then cooled, the molten amorphous silicon layer is recrystallized starting from sides of the seeds so as to form a polycrystalline silicon layer with relatively uniform and large crystal grains.

Figure 6:
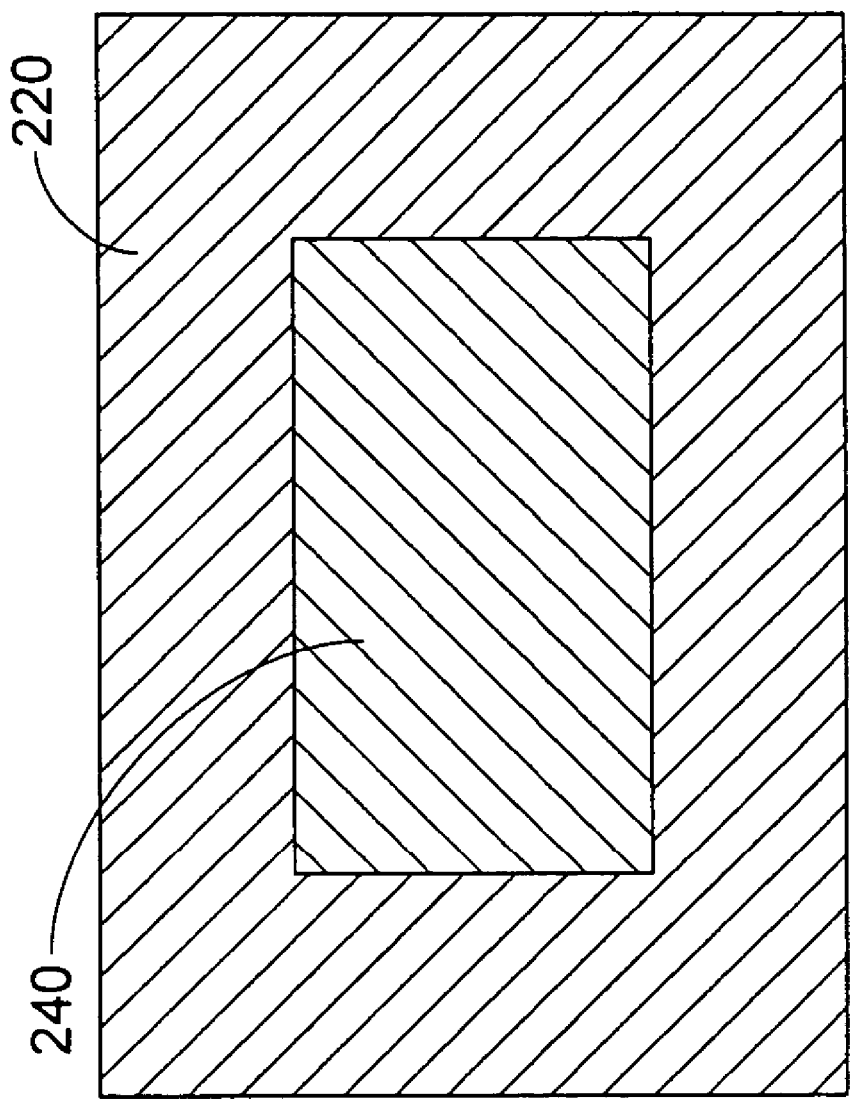
FIG. 6 is a schematic diagram illustrating the simultaneous formation of polycrystalline silicon and microcrystalline silicon regions to obtain two kinds of thin film transistors.

In practice, while some thin film transistors require gate channels formed of polycrystalline silicon layers, others require gate channels made of microcrystalline silicon layers. Sometimes, two types of thin film transistors respectively with these two gate channels are required to be formed on the same glass substrate. Conventionally, these two types of thin film transistors have to be separately manufactured. Such conventional process is complicated and has unsatisfactory reliability. According to the present invention, these two types of transistors can be formed on the glass substrate simultaneously so as to reduce fabrication cost. Referring to FIG. 6, it is assumed that a first region 220 and a second region 240 on a glass substrate are to be formed thereon two types of transistors with polycrystalline silicon and microcrystalline silicon gate channels, respectively. Seeds are first formed on the first region 220 in a manner as described in the above embodiment, but no seeds are formed on the second region 240. Then, an amorphous silicon layer (not shown) is formed on and overlies the first region 220 and the second region 240. The amorphous silicon layer is irradiated with a sufficient intensity of pulse laser to be completely molten. Due to the presence of the remaining seeds after the melting procedure in the first region 220, a polycrystalline silicon layer with relatively uniform and large crystal grains is formed on the first region 220 in the subsequent cooling procedure. Meanwhile, a microcrystalline silicon layer is formed in the second region 240.

From the above description, it is understood that the process for forming a polycrystalline silicon layer by burying seeds under the amorphous silicon layer in advance can make the condition of the applied pulse laser less critical so as to easily obtain a polycrystalline silicon layer with relatively uniform and large crystal grains and thus thin film transistor products with stable electron properties.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for forming a polycrystalline silicon layer, comprising steps of:
   forming at least one seed made of amorphous silicon on a substrate;
   forming an amorphous silicon layer on said substrate, overlying said amorphous silicon seed;
   irradiating said amorphous silicon layer with a laser to melt said amorphous silicon layer; and
   recrystallizing said molten amorphous silicon layer to form a polycrystalline silicon layer;
   wherein said step of forming said at least one seed on said substrate comprises sub-steps of:
      forming an intermediate covering layer on said substrate;
      patterning said intermediate covering layer to define said intermediate covering layer as a specified pattern;
      forming an amorphous silicon spacer beside said specified pattern; and
      removing said specified pattern with said spacer remained.

2. The process according to claim 1 wherein said intermediate covering layer is made of silicon nitride.

3. The process according to claim 1 wherein said intermediate covering layer is made of metal.

4. A process for forming a polycrystalline silicon layer, comprising steps of:
   defining a first region and a second region on a surface of a substrate;
   forming an intermediate covering layer on said first region of said substrate;
   patterning said intermediate covering layer to define said intermediate covering layer as a specified pattern;
   forming an amorphous silicon spacer beside said specified pattern;
   removing said specified pattern with said spacer remained to form at least one seed on said first region of said substrate;
   forming an amorphous silicon layer on said first and said second regions of said substrate;
   irradiating said amorphous silicon layer with a laser to melt said amorphous silicon layer; and
   recrystallizing said molten amorphous silicon layer on said first region to form a polycrystalline silicon layer.

5. The process according to claim 4 wherein said substrate is a glass substrate.

6. The process according to claim 4 wherein said substrate is a plastic substrate.

7. The process according to claim 4 wherein said laser is an excimer laser.

8. The process according to claim 4 wherein said intermediate covering layer is made of silicon nitride.

9. The process according to claim 4 wherein said intermediate covering layer is made of metal.

10. The process according to claim 4 further comprising a step of recrystallizing said molten amorphous silicon layer on said second region to form a microcrystalline silicon layer.

11. A process for fabricating a polycrystalline silicon layer, comprising steps of:
    providing a substrate;
    forming an intermediate covering layer on said substrate;
    patterning said intermediate covering layer to define said intermediate covering layer as a specified pattern;
    forming an amorphous silicon spacer beside said specified pattern;
    removing said specified pattern with said spacer remained to form at least one seed on said substrate;
    forming an amorphous silicon layer on said substrate, overlying said seed;
    irradiating said amorphous silicon layer with a laser to melt said amorphous silicon layer; and
    recrystallizing said molten amorphous silicon layer to form a polycrystalline silicon layer.

12. The process according to claim 11 wherein said substrate is a glass substrate.

13. The process according to claim 11 wherein said substrate is a plastic substrate.

14. The process according to claim 11 wherein said laser is an excimer laser.

15. The process according to claim 11 wherein said intermediate covering layer is made of one of silicon nitride and metal.

16. A process for forming a polycrystalline silicon layer, comprising steps of:
    defining a first region and a second region on a surface of a substrate;
    forming at least one seed on said first region of said substrate;
    forming an amorphous silicon layer on said first and said second regions of said substrate;
    irradiating said amorphous silicon layer on said first region and said second region with a laser to melt said amorphous silicon layer; and
    recrystallizing said molten amorphous silicon layer on said first region and said second region to form a polycrystalline silicon layer and a microcrystalline silicon layer, respectively.

* * * * *